(12) United States Patent
Adams

(10) Patent No.: US 11,127,509 B2
(45) Date of Patent: Sep. 21, 2021

(54) GRAPHENE-COPPER COMPOSITE STRUCTURE AND MANUFACTURING METHOD

(71) Applicant: UltraConductive Copper Company Inc., Lexington, MA (US)

(72) Inventor: Horst Jakob Adams, Houston, TX (US)

(73) Assignee: UltraConductive Copper Company Inc., Lexington, MA (US)

(*) Notice: Subject to any disclaimer, the term of this patent is extended or adjusted under 35 U.S.C. 154(b) by 112 days.

(21) Appl. No.: 15/697,114

(22) Filed: Sep. 6, 2017

(65) Prior Publication Data

US 2018/0102197 A1 Apr. 12, 2018

Related U.S. Application Data

(60) Provisional application No. 62/606,125, filed on Oct. 11, 2016.

(51) Int. Cl.
| | |
|---|---|
| H01B 1/04 | (2006.01) |
| H01B 1/02 | (2006.01) |
| H01B 13/00 | (2006.01) |
| C23C 16/26 | (2006.01) |
| B32B 9/04 | (2006.01) |

(52) U.S. Cl.
CPC ............... *H01B 1/04* (2013.01); *B32B 9/041* (2013.01); *C23C 16/26* (2013.01); *H01B 1/026* (2013.01); *H01B 13/0016* (2013.01); *B32B 2250/40* (2013.01); *B32B 2307/202* (2013.01)

(58) Field of Classification Search
CPC .......... H01B 1/04; C23C 16/26; C01B 32/182
See application file for complete search history.

(56) References Cited

U.S. PATENT DOCUMENTS

| | | | |
|---|---|---|---|
| 8,263,843 | B2 | 9/2012 | Kim et al. |
| 2009/0029221 | A1 | 1/2009 | Goddard et al. |
| 2011/0226509 | A1 | 9/2011 | Kim et al. |

(Continued)

FOREIGN PATENT DOCUMENTS

| | | | | |
|---|---|---|---|---|
| CN | 106584976 | * | 4/2017 | ............. B32B 15/01 |
| CN | 106584976 A | | 4/2017 | |

(Continued)

OTHER PUBLICATIONS

Goli—Thermal properties of graphene-Cu-Graphene films—Nano Lett.—2014 (Year: 2014).*

(Continued)

*Primary Examiner* — Callie E Shosho
*Assistant Examiner* — John Vincent Lawler
(74) *Attorney, Agent, or Firm* — Leydig, Voit & Mayer, Ltd.

(57) ABSTRACT

A composite structure comprises a copper layer and first and second graphene layers sandwiching the copper layer, wherein the composite structure provides electron-path tunnels between the copper layer and the first and second graphene layers. The electron-path tunnels may enhance the electrical conductivity. A multilayer composite structure comprises a first copper layer, a first graphene layer on the first copper layer, a second graphene layer on the first graphene layer, and a second copper layer on the second graphene layer.

5 Claims, 16 Drawing Sheets

(56) References Cited

U.S. PATENT DOCUMENTS

| | | | |
|---|---|---|---|
| 2013/0174968 A1 | 7/2013 | Vlassiouk et al. | |
| 2015/0023858 A1 | 1/2015 | Tour et al. | |
| 2015/0122320 A1 | 5/2015 | Wu et al. | |
| 2015/0194241 A1 | 7/2015 | Tanielian | |
| 2015/0319881 A1 | 11/2015 | Kusuda et al. | |
| 2015/0337458 A1 | 11/2015 | Duan et al. | |
| 2015/0361584 A1* | 12/2015 | Chiba | C30B 29/02 117/101 |
| 2016/0115032 A1 | 4/2016 | Wodtke et al. | |
| 2017/0338312 A1 | 11/2017 | Treossi et al. | |
| 2018/0069082 A1 | 3/2018 | Jung et al. | |

FOREIGN PATENT DOCUMENTS

| | | |
|---|---|---|
| CN | 107403656 A | 11/2017 |
| EP | 2979540 A1 | 1/2014 |
| EP | 3252778 A1 | 12/2017 |
| GB | 2530974 A | 4/2016 |

OTHER PUBLICATIONS

Hong—Tuning therm.contact conductance at graphene-copper interface via service nano-engineering—Roy.Soc.Chem.—2015 (Year: 2015).*

Firkowska—high therm.Cond Cu-Graphite composites—2015 (Year: 2015).*

Proton exchange membranes—Argonne Today—2015 (Year: 2015).*

Mehta—Elect+Therm.Conduction in Graphene-Encapsulated Cu nanowires—Nano Lett. 2015 (Year: 2015).*

Mohsin—current transport in graphene-copper hybrid nano-ribbon—111 Cu—Electro.Chem.Soc. Trans.—2016 (Year: 2016).*

Adams—Internl. Copper Assoc.—report-ultra-conductive-copper-development—2016 (Year: 2016).*

Xiong, Cao, Tan, Fan, Li, and Zhang—CN106584976A—MT—graphene-copper-111 laminate—2017 (Year: 2017).*

Xiong—laminating of graphene-copper laminate with hot pressing—Sci.Report.Nature—Sep. 2016 (Year: 2016).*

Ajmal et al., "Fabrication of the best conductor from single-crystal copper and the contribution of grain boundaries to the Debye temperature," *CrystEngComm*, 14, pp. 1463-1467 (2012).

Blöchl, "Projector Augmented-Wave Method," *Physical Review B*, 50(24), pp. 17953-17979 (Dec. 15, 1994).

Bolotin et al., "Ultrahigh Electron Mobility in Suspended Graphene," *Solid State Comm.*, 146, pp. 351-355 (Mar. 6, 2008).

Che et al., "Retained Carrier-Mobility and Enhanced Plasmonic-Photovoltaics of Graphene via ring-centered $\eta^6$ Functionalization and Nanointerfacing," Nano Lett., 9 pp. (Jun. 6, 2017).

Goli, "Thermal Properties of Graphene-Copper-Graphene Heterogeneous Films," *Nano Letters*, 14, pp. 1497-1503 (2014).

Kresse et al. "Efficient Iterative Schemes for Ab Initio Total-Energy Calculations Using a Plane-Wave Basis Set," *Physical Review B*, 54(16), pp. 11169-11186 (Oct. 15, 1996).

Li et al., "Enhanced Mechanical Properties of Graphene (Reduced Graphene Oxide)/Aluminum Composites with a Bioinspired Nanolaminated Structures," *Nano Lett.*, 15, pp. 8077-8083 (Nov. 17, 2015).

Li et al., "A Versatile Method for Uniform Dispersion of Nanocarbons in Metal Matrix Based on Electrostatic Interactions," *Nano-Micro Lett.*, 8(1), pp. 54-60 (2016).

Monkhorst et al., "Special points for Brillouin-zone integrations," *Physical Review B*, 13(12), pp. 5188-5192 (Jun. 15, 1976).

Polsen et al., "High-speed roll-to-roll manufacturing of graphene using concentric tube CVD reactor," *Scientific Reports*, 5, pp. 1-12 (May 21, 2015).

Wang et al., "Reinforcement with graphene nanosheets in aluminum matrix composites," *Scripta Materialia*, 66, pp. 594-597 (Jan. 16, 2012).

Ishihara et al., "Direct evidence of advantage of Cu (111) for graphene synthesis by using Raman mapping and electron backscatter diffraction," *Materials Letters*, 65(19-20): 2864-2867 (Jun. 21, 2011).

Li et al., "Large-area synthesis of high-quality and uniform graphene films on copper foils," *Science*, 324(5932): 1312-1314 (Jun. 5, 2009).

Mafra et al., "Facile graphene transfer directly to target substrates with a reusable metal catalyst," *Nanoscale*, 7(36): 14807-14812 (Jan. 1, 2015).

Tian et al., "Surface structure deduced differences of copper foil and film for graphene CVD growth," *Applied Surface Science*, 300: 73-79 (Feb. 15, 2014).

Wood et al., "Effects of Polycrystalline Cu substrate on Graphene Growth by Chemical Vapor Deposition," *Nano Letters*, 11(11): 4547-4554 (Sep. 23, 2011).

* cited by examiner

GRAPHENE-COPPER COMPOSITE STRUCTURE AND MANUFACTURING METHOD

CROSS-REFERENCE TO RELATED APPLICATIONS

The instant application claims priority to and is a continuation-in-part of copending U.S. patent application Ser. No. 15/290,865, which was filed on Oct. 11, 2016, and is incorporated herein in its entirety by this reference.

FIELD OF THE DISCLOSURE

The present disclosure relates to increasing the electrical conductivity of copper.

BACKGROUND

Every year more than ten million tons of copper (Cu) are used for electrical and electronic purpose in the world, as it is a cost-effective and reliable electrically conductive material for many applications and second only to silver in its ability to conduct electricity. Extensive research efforts have been dedicated to improving the electrical conductivity of copper, such as producing copper with a purity as high as 7N or oxygen content as low as $1 \times 10^{-4}$%, but an improvement of only ~3% has been achieved in this highly refined copper since the electrical conductivity of copper was first officially recorded about 100 years ago.

DETAILED DESCRIPTION

Figure 1:
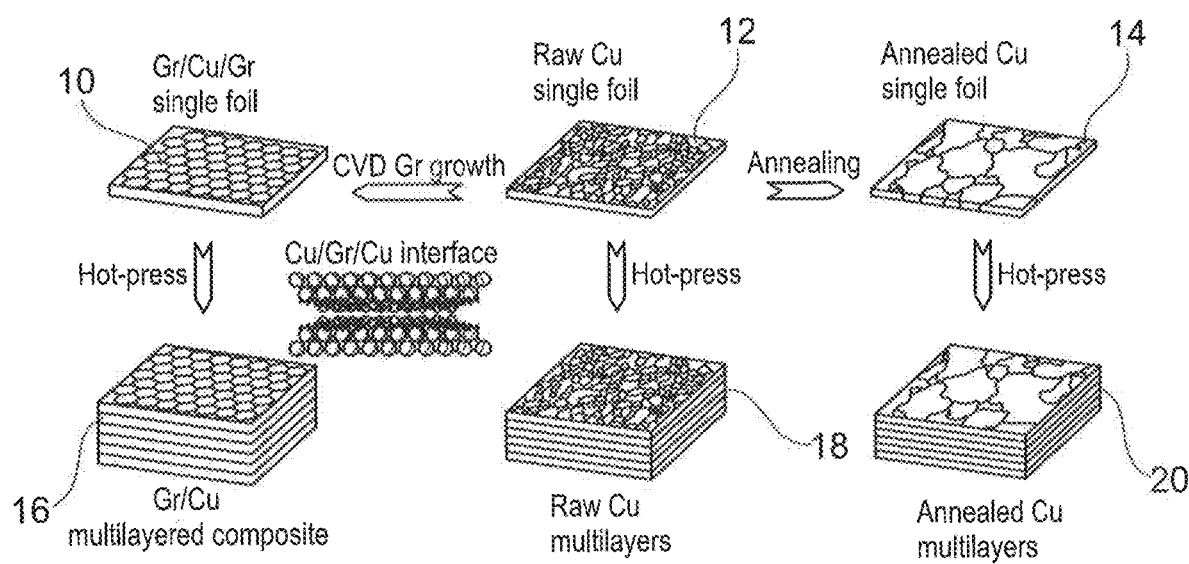
FIG. 1 is a schematic of the sample preparation according to an example.

The present disclosure relates to composite structures using Copper and Graphene, which possess improved electrical conductivity over Copper alone. Graphene (Gr) is a one-atom-thick, two dimensional carbon material, that is currently used in thermal and mechanical applications. Graphene's electrical conductivity has also been previously explored, but its theoretical ability to improve electrical conductivity of bulk metals has yet to be verified experimentally, until now. Graphene is known to have a remarkable electron mobility, reaching a value exceeding 200,000 $cm^2V^{-1}s^{-1}$ at electron densities of ~$2 \times 10^{11}$ $cm^{-2}$ in a suspended single layer graphene sheet, as demonstrated by K. I. Bolotin, K. J. Sikes, Z. Jiang, M. Klima, G. Fudenberg, J. Hone, P. Kim, H. L. Stormer, Solid State Comm. 2008, 146, 351. According to some recent reports, the electrical and thermal benefits of graphene capping on both micro- and nanoscale Cu wires are mainly attributed to the significant reduction in surface scattering of electrons. However, these properties cannot be simply extended to bulk graphene-Cu composites due to the markedly different behavior of graphene embedded in a matrix and graphene with a free surface. For example, graphene is known to have a high intrinsic thermal conductivity, which can reach a level of $K \approx 5,000$ W $m^{-1}K^{-1}$ at room temperature in suspended and sufficiently large high-quality samples. However, graphene deposition on substrates results in a degradation of thermal conductivity to ~600 W $m^{-1}K^{-1}$ due to phonon scattering at the substrate defects and at the interface.

In view of the problems of the prior art, the present disclosure relates to technology that has been developed for making ultra-conductive copper with an electrical conductivity of up to 116% IACS by incorporating graphene layers onto or into the Cu matrix. Both theoretical and experimental analyses of the different effects contributing to the increase inconductivity are presented.

The present disclosure generally relates to a composite structure comprising a copper layer and first and second graphene layers sandwiching the copper layer, wherein the composite structure provides electron-path tunnels between the copper layer and the first and second graphene layers.

The formation of electron transfer tunnels between the electron sea of the copper layer and the pi orbitals of the carbon atoms in the first and second graphene layers may provide for an enhanced electric conductivity of the composite structure.

In an example, the first graphene layer and/or the second graphene layer are graphene monolayers or bi-layers.

At least part of the copper layer may have a (111) crystallographic orientation.

The atomic spacing in the copper (111) direction closely matches the graphene lattice constant. The carbon atom lattice of the graphene film attached to the copper layer may hence act as a seed structure or template to promote a re-orientation of the copper plane. This may support the formation of an abundance of electron transfer tunnels between the electron sea with high mean free paths of the closely matching copper (111) plane and the pi orbitals of the carbon atoms in the graphene lattice.

In an example, a lattice constant of at least one crystalline plane of the copper layer is within 4% of a lattice constant of the first graphene layer and/or the second graphene layer.

A plurality of composite structures with some or all of the features described above may be stacked to form a multi-layer composite structure.

In particular, a first graphene layer of a first structure of the plurality of structures may contact a second graphene layer of a second structure of the plurality of structures.

The resulting bi-layer structure may provide for enhanced electric conductivity.

In particular, a multilayer composite structure may comprise a first graphene layer, a first copper layer on the first graphene layer, a graphene bi-layer on the first copper layer, a second copper layer on the graphene bi-layer, and a second graphene layer on the second copper layer.

Any number of composite structures may be formed as described above and combined in a stack.

The multilayer composite structure constitutes an independent aspect of the present disclosure.

Hence, the disclosure also relates to a multilayer composite structure, comprising a first copper layer, a first graphene layer on the first copper layer, a second graphene layer on the first graphene layer, and a second copper layer on the second graphene layer.

The multilayer composite structure with first and second graphene layers sandwiched by a first copper layer and a second copper layer allow the formation of electron-path tunnels from the first copper layer, through the first and second graphene layers and into the second copper layer, which may enhance the electric conductivity.

In an example, a first surface side of the first graphene layer is deposited on or grown on the first copper layer, and a second surface side of the first graphene layer may contact the second graphene layer, wherein the second surface side is opposite from the first surface side.

A first surface side of the second graphene layer may be deposited on or grown on the second copper layer, and a second surface side of the second graphene layer contacts the first graphene layer, wherein the second surface side is opposite from the first surface side.

The composite structure or multi-layer-composite structure according to the disclosure may have an electric conductivity of at least 116% IACS (International Annealed Copper Standard), where 100% IACS corresponds to the conductivity of pure copper and approx. 108% IACS corresponds to the conductivity of pure silver.

The disclosure further relates to a method for forming a multilayer structure, comprising: providing a first copper foil; depositing graphene layers on opposing surface sides of the first copper foil by means of chemical vapor deposition to form a first composite structure; providing a second copper foil; depositing graphene layers on opposing surface sides of the second copper foil by means of chemical vapor deposition to form a second composite structure; and stacking the first composite structure and the second composite structure to form a multilayer structure.

Any number of composite structures may be formed as described above and combined in the multilayer structure.

In an example, the chemical vapor deposition comprises introducing methane as a precursor gas.

The chemical vapor deposition may be performed at temperatures in the range between 900° C. and 1100° C.

In an example, the stacking comprises hot-pressing.

The hot-pressing may be performed at a temperature in the range between 800° C. and 1000° C.

The method with some or all of the features described above may allow to manufacture a multi-layer composite structure with enhanced electric conductivity, and can be efficiently scaled to industry levels to produce large quantities of material.

In an example, the multilayer structure provides electron-path tunnels between the copper foil and the graphene layers.

The graphene layers may be graphene monolayers or graphene bi-layers.

At least part of the copper foil may have a (111) crystallographic orientation.

In an example, a lattice constant of at least one crystalline plane of the copper foil is within 4% of a lattice constant of the graphene layers.

The multilayer structure may have an electric conductivity of at least 116% IACS.

The disclosure further relates to a method of making an ultra-conductive graphene-copper matrix composite, the method comprising embedding graphene into a copper matrix to provide electron-path tunnels between the graphene and the copper matrix.

In an example, an atomic spacing of at least one crystalline plane of the copper matrix is within 4% of a lattice constant of the graphene.

The disclosure further relates to a method of making an ultra-conductive graphene-metal matrix composite, the method comprising embedding graphene into a metal matrix to provide electron-path tunnels between the graphene and the metal matrix, wherein the atomic spacing of at least one crystalline plane of the metal matrix is within 4% of a graphene lattice constant.

Specific examples of the composite structure and method according to the present disclosure will now be described in additional detail with reference to the drawings.

An example relates to a Gr/Cu multilayered composite as a model to explore the possible role of graphene on improving the electrical conductivity of copper by chemical vapor deposition (CVD) of graphene on both sides of micrometer-scale Cu foils and then hot-pressing a multitude of the as-obtained Gr-Cu-Gr heterogeneous foils together to form bulk samples of highly conductive composite material. Electrical measurements demonstrate that introducing graphene into the Cu matrix results in ultrahigh interface- and bulk electrical conductivity in the resulting Gr/Cu multilayered composite, with an interface conductivity of three orders of magnitude higher than the conductivity of the pure Cu matrix, and a bulk electrical conductivity of up to 16% higher than that of Cu. Our experimental results and first-principles calculations suggest that the ultrahigh interfacial and bulk conductivities are primarily due to graphene-promoted changes in the Cu morphology and crystallinity, as well as electron doping effects on graphene caused by the Cu matrix. The ultrahigh electrical conductivity shows the potential to have a significant impact on a wide range of applications of Cu for electrically and thermally conducting purposes. The relationship between electrical conductivity enhancement and interface properties as well as the matrix microstructure are of significance for designing advanced Cu-based materials with ultrahigh electrical conductivity and strength, which could be achieved in Gr/Cu nano-layered composites because of the markedly increased volume fraction of such ultrahigh conductive interfacial layers, coupled with the outstanding strengthening effect of graphene in metals.

FIG. 1 is a schematic of the sample preparation of a graphene-copper composite structure 10. Graphene was deposited on both sides of a pristine Cu foil 12 by chemical vapor deposition. Pristine Cu, annealed under the same condition without graphene deposition, was also prepared as a reference sample 14. Several pieces of single foil 10 were stacked and then transformed into thicker multilayer sheet 16 by a hot-pressing process. The Gr/Cu multilayered composites 16 were fabricated by chemical vapor deposition (CVD) of graphene on both sides of 30-μm thick Cu foils 12 and then hot-pressing five pieces of the resulting Gr-Cu-Gr heterogeneous foil 10 into a 150-μm thick sheet. The number of atomic planes in the graphene films on the Cu foil was verified with Raman spectroscopy, and the $I_{2D}/I_G$ ratio of about 2.3 indicated that the deposited graphene on the Cu foils was mostly single layered (see FIG. 6). Therefore, the interfaces in the Gr/Cu multilayered composites 16 were composed of Cu/Gr bilayer/Cu because of the stacked Gr-Cu-Gr multilayers.

Figure 7:
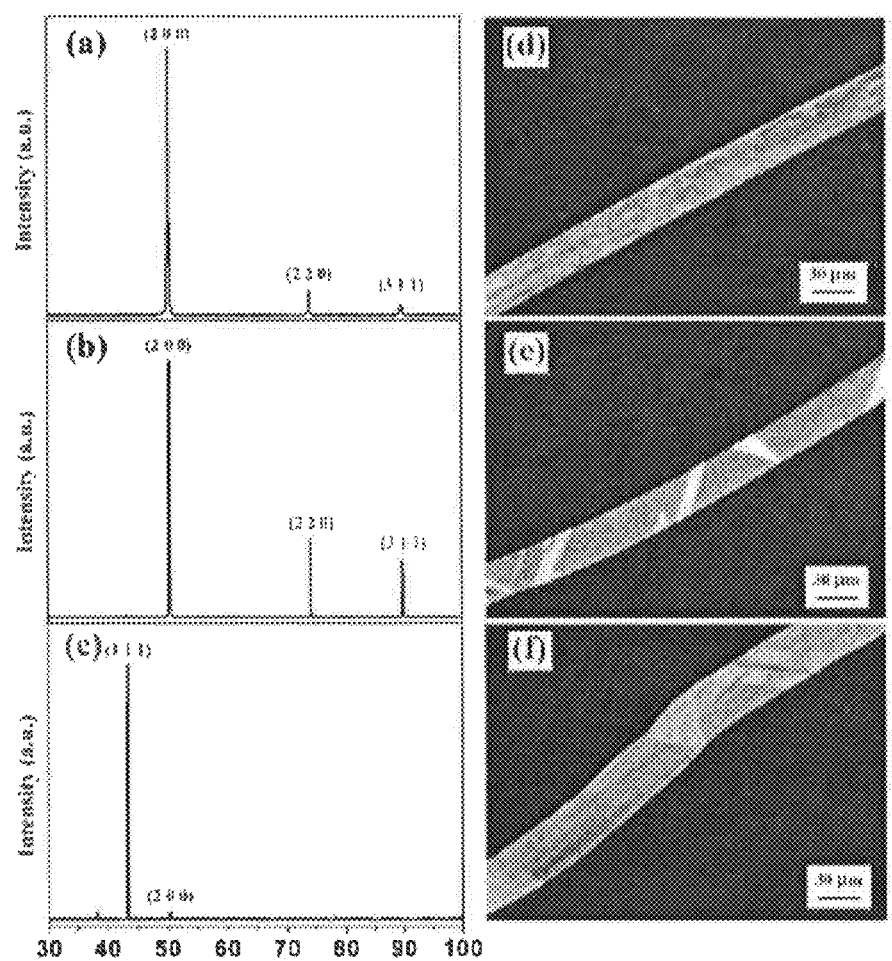
FIG. 7 shows in-plane XRD patterns and cross-section optical images of single foils of pristine Cu, annealed Cu, and Gr/Cu according to an example.

For reference, we also prepared two other multilayer sample types from a) pristine Cu foils ("as rolled") without graphene or any thermal treatment 18, and b) Cu foils annealed under the same temperature as the one used during CVD of graphene but without graphene deposition 20 (see FIG. 7). Thus, for comparison with the ultra-conductive samples, we used hot-pressed multilayers of pristine Cu, and annealed Cu, Gr-Cu-Gr foils, respectively (see FIG. 8).

Figure 2:
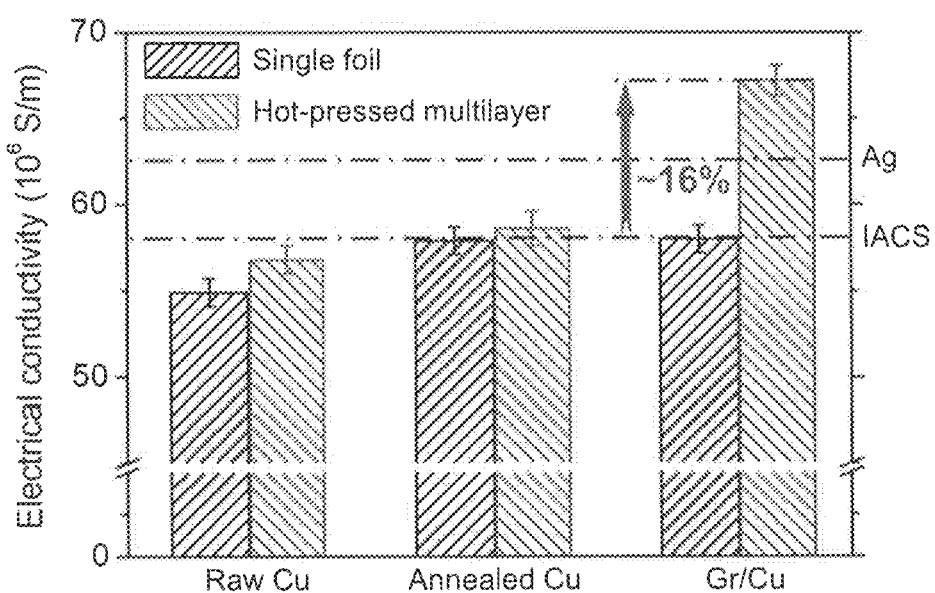
FIG. 2 shows the average electrical conductivities of both single foil, and hot-pressed multilayer samples of: pristine Cu, annealed Cu and Gr/Cu according to an example.

FIG. 2 shows the average electrical conductivities of both single foil, and hot-pressed multilayer samples of: pristine Cu, annealed Cu and Gr/Cu. The electrical conductivities of the International Annealed Copper Standard (IACS, $58.1 \times 10^6$ S m$^{-1}$) and Ag (~108% IACS) are also shown for comparison.

Using a standard four-probe method (see FIG. 9), the electrical conductivity of the pristine Cu single foil 12 was measured to be $54.9 \times 10^6$ S m$^{-1}$ (94.7% IACS); the conductivity increased to $57.9 \times 10^6$ S m$^{-1}$ by annealing the Cu sample, and reached $58 \times 10^6$ S m$^{-1}$ by the deposition of graphene on the Cu surface, approaching but not exceeding the 10% IACS level. While the hot-pressing process could further slightly raise the electrical conductivity by 2.8% IACS in the pristine Cu multilayer 18 and by 1% IACS in the annealed Cu multilayer 20, a significant enhancement of up to 16% IACS and an ultrahigh bulk electrical conductivity of $67.2 \times 10^6$ S m$^{-1}$ was obtained in the Cu/Gr-Gr/Cu multilayered composites 16, which is even higher than that of the best conductive metal Ag.

Figure 3:
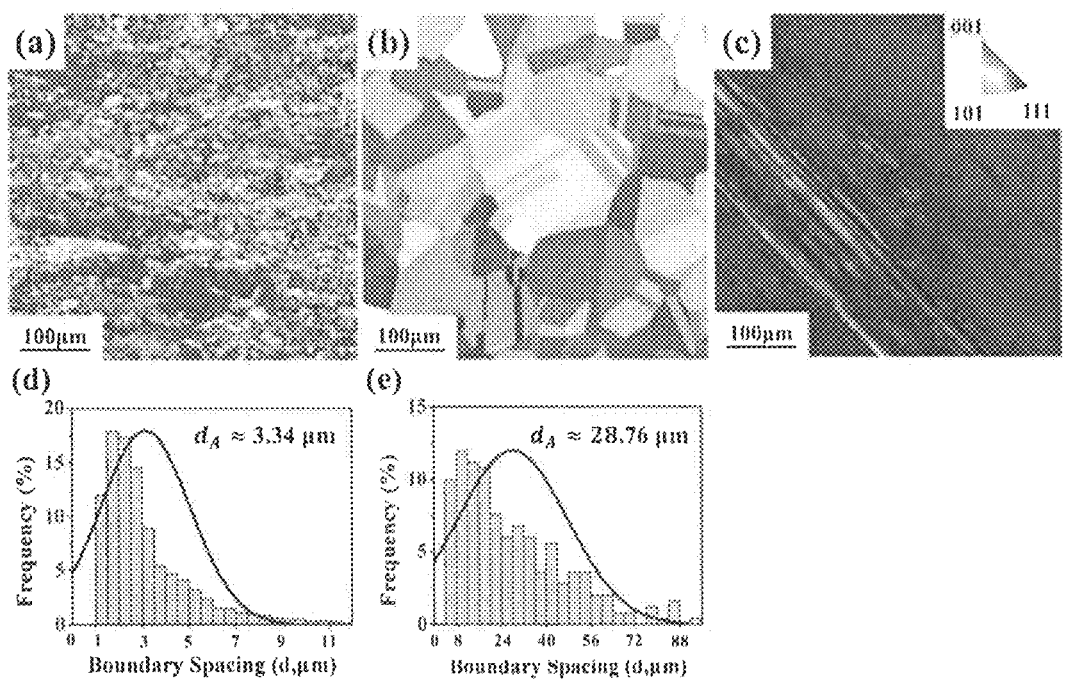
FIG. 3 is a texture analysis by inverse pole figure (IPF) map and grain size statistics according to an example.

Electron scattering on grain boundaries is generally believed to be a main factor of electrical resistivity. To investigate the Cu morphology evolution after the different processing procedures, analyses of the grain size distribution and surface texture were carried out by electron backscattered diffraction (EBSD) on the single foils of pristine Cu 12, annealed Cu 14, and Gr-Cu-Gr 10, respectively. FIG. 3 is a texture analysis by inverse pole figure (IPF) map and grain size statistics based on EBSD for the single foils of pristine Cu (cf. FIG. 3a, 3d), annealed Cu (cf. FIG. 3b, 3e), and Gr/Cu/Gr (cf. FIG. 3c). FIG. 3 shows that the annealing treatment resulted in remarkable grain growth in the single foils because the processing temperature of 1,000° C. is sufficiently higher than the Cu recrystallization temperature of 227° C. As a consequence, the low electrical conductivity of pristine Cu single foils can be explained by grain refinement during its rolling fabrication process, while the conductivity recovered up to the level of 100% IACS after annealing due to grain coarsening. Moreover, chemical vapor deposition of graphene on the Cu surface results in an even substantially stronger enlargement of the Cu grains than that caused by the annealing treatment under the same temperature conditions. We also observed that a grain reorientation took place during CVD of graphene. However, compared to the annealing treatment these stronger changes in grain size and orientation during CVD of graphene did not lead to any additional enhancement of the electrical conductivity of the individual foils.

Goli et al., Nano Lett. 2014, 14, 1497, demonstrated an increase of thermal conductivity by 16~24% in CVD-Gr/Cu/CVD-Gr heterogeneous foils as compared to the reference pristine Cu and annealed Cu, which was primarily arising from the changes of Cu morphology and the strong enlargement of Cu grains during CVD of graphene. However, the electrical conductivities of their samples were in line with the standard values for Cu foils, and did not scale up linearly with the increased thermal conductivity as predicted by the Wiedemann-Franz law K/σ=LT, where K is the thermal conductivity, σ is the electrical conductivity and $L=(\pi^2/3)(\kappa_B/q)^2 \approx 2.44 \times 10^{-8}$ WΩK$^{-2}$ is the Lorenz number. These results are consistent with our findings that CVD of graphene on both sides of a several tens of micrometers thick Cu foil did not lead to any additional electrical conductivity compared to a Cu foil annealed under the same conditions but without graphene deposition.

Additionally, the thickness of the graphene layer h=0.34 nm is negligibly small compared to that of the Cu foil H=30 μm, and also H is much larger than the electron mean free path in Cu (40 nm at 298 K). Therefore the reduction in surface scattering of electrons by surface graphene layers demonstrated in nanomaterials is negligible here.

Figure 10:
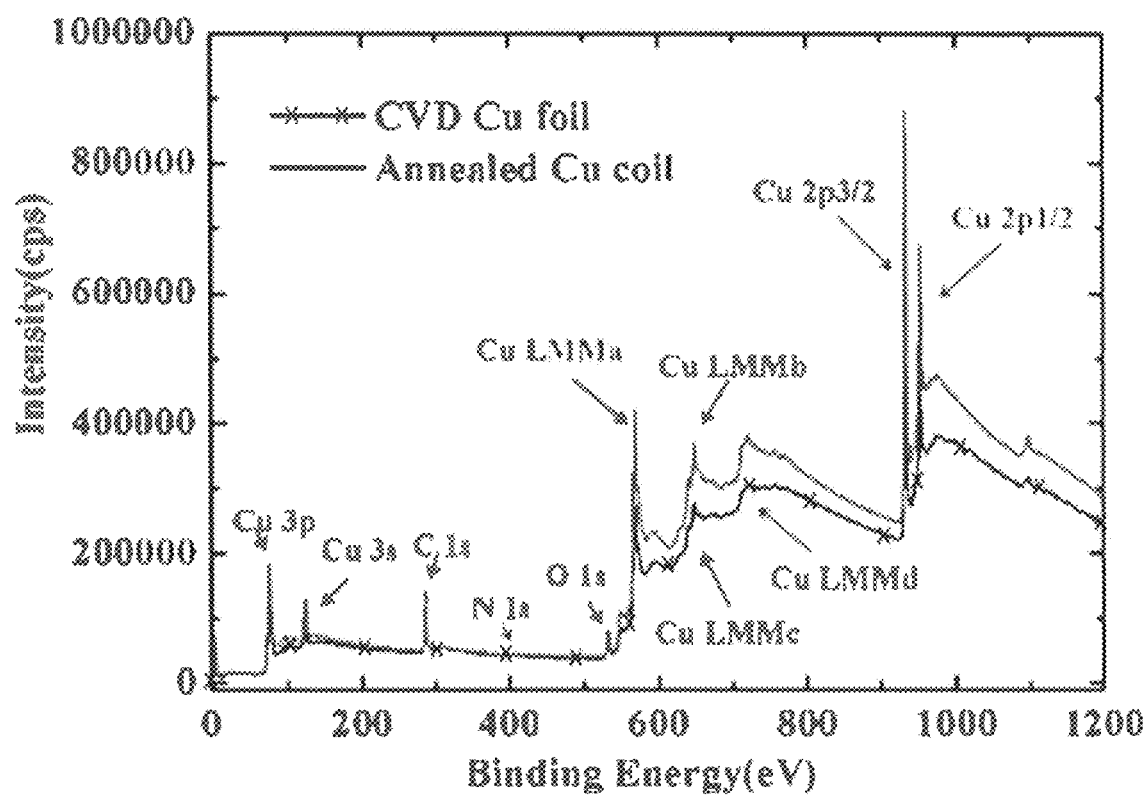
FIG. 10 shows XPS data for the annealed Cu single foil, and Cu single layer foil with chemically deposited graphene according to an example.

In order to exclude any possible influence of impurities on the electrical conductivity, we also performed X-ray photoelectron spectroscopy (XPS) and energy-dispersive X-ray (EDX) spectroscopy analyses on Gr-Cu-Gr single foils and reference annealed Cu single foils, revealing that there is no perceivable difference in the impurity contents, including O and N, between the two single foil types (see FIG. 10).

Although the strong enlargement and reorientation of Cu grains after CVD of graphene did not lead to any direct advantages over the annealing treatment on improving the electrical conductivity of single Cu foils, both effects proved to be beneficial for enhancing crystallinity and thus electrical conductivity in Gr-Cu multilayered composites 16 produced by hot-pressing several single layer samples 10 together. High-resolution X-ray diffraction pole figures showed that, with the hot-pressing treatment, the intensity of the main peak Cu(111) was enhanced in the hot-pressed Gr-Cu multilayered composite 16, while the additional small Cu(200) and other peaks caused by weakly tilted orientation states in the single Gr-Cu-Gr foil 10 were attenuated, suggesting that an enhancement of the preferred texture and crystallinity might be responsible for enhancing the electrical conductivity in Gr-Cu multilayered composites 16 (see FIG. 11). Ajmal et al, CrystEngComm 2012, 14, 1463 previously reported that hot isostatic pressing of a single-crystal Cu sample could increase the electrical conductivity by 5.5% because of the increased crystallinity.

In our work, an enhancement of up to 16% was obtained, and we think that graphene CVD might have contributed in promoting grain reorientation and curing grain boundaries during the hot-pressing process because of the matching lattice constants of graphene (2.46 Å) and Cu(111) (2.56 Å). The atomic spacing in the Cu(111) direction is within 4% of the graphene lattice constant, which is why the connection between graphene and copper works so well. We think that the C-atom lattice of the graphene film attached to the thin Cu-foil acts as a seed-structure or template for the preferred re-orientation of the Cu(111) grain plane toward the graphene layer during the hot pressing process. This in turn causes the formation of an abundance of electron transfer tunnels between the electron sea with high mean free path of the closely matching Cu(111) plane and the pi-orbitals of the C-atoms in the graphene lattice.

Table 1 shows the room temperature crystal structures for several metals commonly used in industrial applications. The listed metals have respective unit cell structures described as body center cubic (bcc), face centered cubic (fcc), or hexagonal close packed (hcp). The table is sorted by the mismatch percentage between the graphene lattice constant and the atomic spacing of the preferred plane in the respective metal. Only four different metals (Fe, Ni, Cr, Co) show better lattice matches than Cu, none of which has any potential to be used as electrical conductor in industrial applications. However, the metals with a mismatch <4% (in particular Fe, Co, Cu) are the preferred catalysts used for the formation of nano-carbons including carbon nanotubes. We think that these relations make copper, in particular in the special setup Cu-Gr-Gr-Cu we found to provide the highest conductivity, the ideal candidate to form the above mentioned easy-electron-path tunnels between the graphene layer and the copper matrix and thus can act as an ultra-conductive composite material in combination with graphene.

Other metals frequently used in conventional cable applications, like aluminum and magnesium, have a mismatch which is too big to allow for a comparably easy electron transfer between the metal and the carbon lattice. We think that this is not only true for the combination of the respective metal with graphene but equally valid for the combination with other C-structures like carbon nanotubes.

TABLE 1

Room temperature crystal structure and atomic spacing of elemental metals.

| metal | crystal structure | atomic spacing (nm) | mismatch (+/- %) |
|---|---|---|---|
| Iron (Alpha) | BCC | 0.2482 | 0.9 |
| Nickel | FCC | 0.2492 | 1.3 |
| Chromium | BCC | 0.2498 | 1.5 |
| Cobalt(Alpha) | HCP | 0.2506 | 1.9 |
| Cobalt(Beta) | FCC | 0.2506 | 1.9 |
| Copper | FCC | 0.2556 | 3.9 |
| Iron (Gamma) | FCC | 0.2576 | 4.7 |
| Vanadium | BCC | 0.2622 | 6.6 |
| Ruthenium | HCP | 0.2650 | 7.7 |
| Zinc | HCP | 0.2664 | 8.3 |
| Osmium | HCP | 0.2676 | 8.8 |
| Rhodium | FCC | 0.2690 | 9.3 |
| Iridium | FCC | 0.2700 | 9.8 |
| Beryllium | HCP | 0.2226 | -10.5 |
| Molybdenum | BCC | 0.2726 | 10.8 |
| Rhenium | HCP | 0.2740 | 11.4 |
| Palladium | FCC | 0.2740 | 11.4 |
| Tungsten | BCC | 0.2742 | 11.5 |
| Platinum | FCC | 0.2776 | 12.8 |
| Titanium (Beta) | BCC | 0.2858 | 16.2 |
| Niobium | BCC | 0.2858 | 16.2 |
| Tantalum | BCC | 0.2860 | 16.3 |
| Aluminum | FCC | 0.2868 | 16.6 |
| Gold | FCC | 0.2884 | 17.2 |
| Silver | FCC | 0.2888 | 17.4 |
| Titanium (Alpha) | HCP | 0.2890 | 17.5 |
| Cadmium | HCP | 0.2978 | 21.5 |
| Zirconium(Beta) | BCC | 0.3124 | 27.0 |
| Zirconium(Alpha) | HCP | 0.3170 | 28.9 |
| Magnesium | HCP | 0.3198 | 30.0 |
| Lead | FCC | 0.3500 | 42.3 |

The role of graphene in promoting an improvement in electrical conductivity of copper is supported by the additional results obtained from a control sample, manufactured by hot-pressing just one Gr-Cu-Gr single foil sandwiched between several annealed Cu foils, showing a transitional (intermediate) preferred orientation and an electrical conductivity outperforming the rule of mixture (see FIG. 12). In contrast, as revealed by X-ray diffraction patterns, the preferred orientation in both the pristine and annealed Cu single foils (without attached graphene layer) remarkably degraded after the hot-pressing treatment.

Figure 12A:
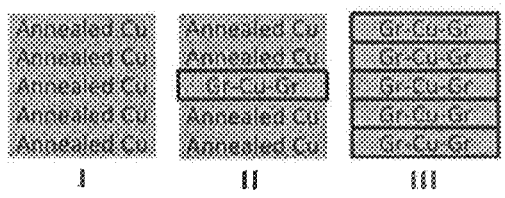
FIGS. 12A-D show possible graphene-promoted grain re-orientation during a hot-pressing process according to an example.
Figure 12B:
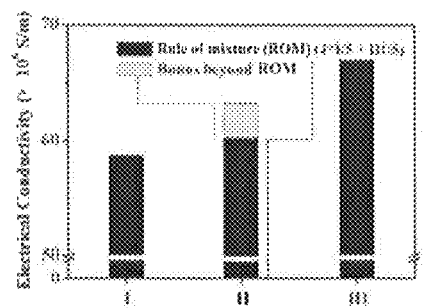
Figure 12C:
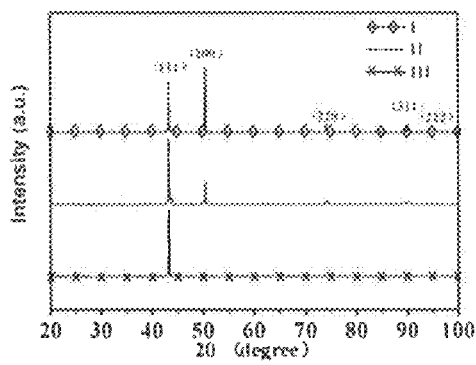
Figure 12D:
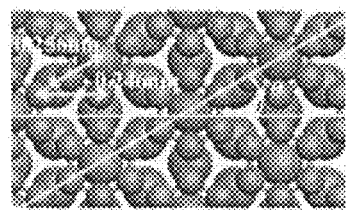

FIGS. 12A-D show possible graphene-promoted grain re-orientation during a hot-pressing process. FIG. 12A schematically depicts hot-pressed multilayered samples from (I) the annealed Cu foils, (II) one Gr-Cu-Gr foil sandwiched between several annealed Cu foils, and (III) the Gr-Cu-Gr foils. FIG. 12B shows electrical conductivity values of the samples of I, II and III. The sample II shows an electrical conductivity higher than that calculated from the rule of mixture based on the electrical conductivities of the samples I and III. FIG. 12C shows X-ray diffraction patterns indicate that sample II has a transitional (intermediate) texture laying between that of sample I and II in terms of peak intensity ratio of $I_{(111)}/I_{(200)}$, suggesting, as shown in FIG. 12D, a possible graphene-promoted grain re-orientation during the hot-pressing process because of the matching lattice constant between graphene (2.46 Å) and Cu(111) (2.56 Å).

The interface between the additive (in this case, graphene) and the matrix material (in this case, Cu) has a major effect on the electrical and thermal conductivity of the composite material. To evaluate the electrical properties of the interfaces between the different layers, the electrical conductivity of a selected area across the Cu/Gr-Gr/Cu interface area was investigated by using the contact-current mode of a scanning probe microscope under an applied voltage of 100 mV at room temperature (see FIG. 13).

Figure 13:
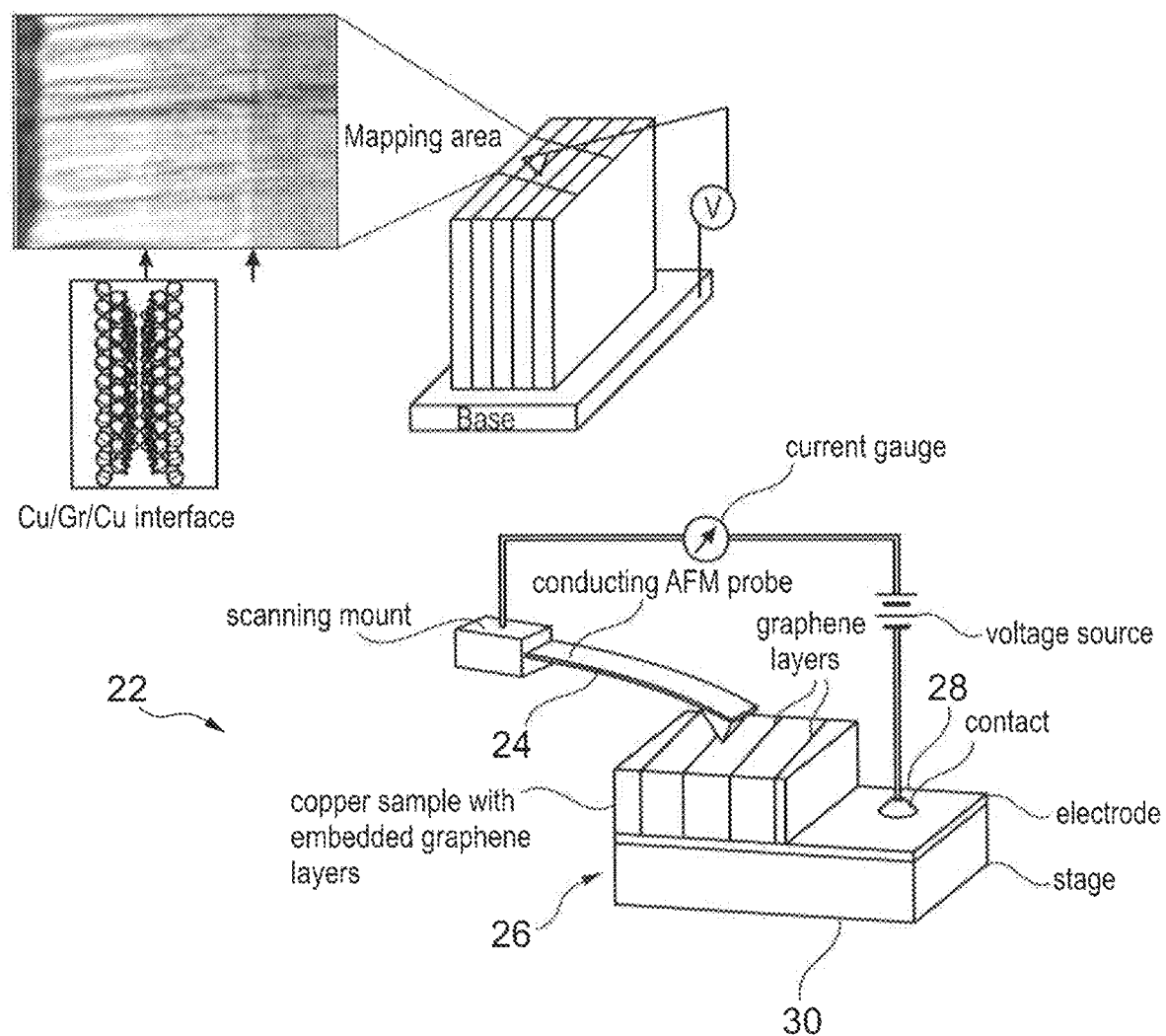
FIG. 13 is a schematic representation of the electrical properties measurement on the interface layers using the contact-current mode of a customized scanning probe microscope according to an example.

FIG. 13 is a schematic representation of the electrical properties measurement on the interface layers using the contact-current mode of a customized scanning probe microscope 22. A cantilever 24 of the atomic force microscope 22 is moved across the layered structure of the sample 26. The scanning contact probe is built into the vacuum chamber of an SEM. A voltage is applied to the sample 26 between the sample base 28 and the cantilever probe 24. The probe is scanned across the "mapping area" to map the current flowing between probe 24 and base 28. The sample 26 is a multilayer 1 cm×1 cm sandwich of Cu foils and interstitial graphene layers.

One surface of a Gr/Cu multilayered composite sample 26 was attached (and electrically connected) to the sample stage 30, while a Pt-coated Si-cantilever 24 with the applied voltage was positioned on the opposite surface. A typical current-mapping image produced by scanning the cantilever probe inside the electron-microscope across the different layers is shown in FIG. 4.

Figure 4:
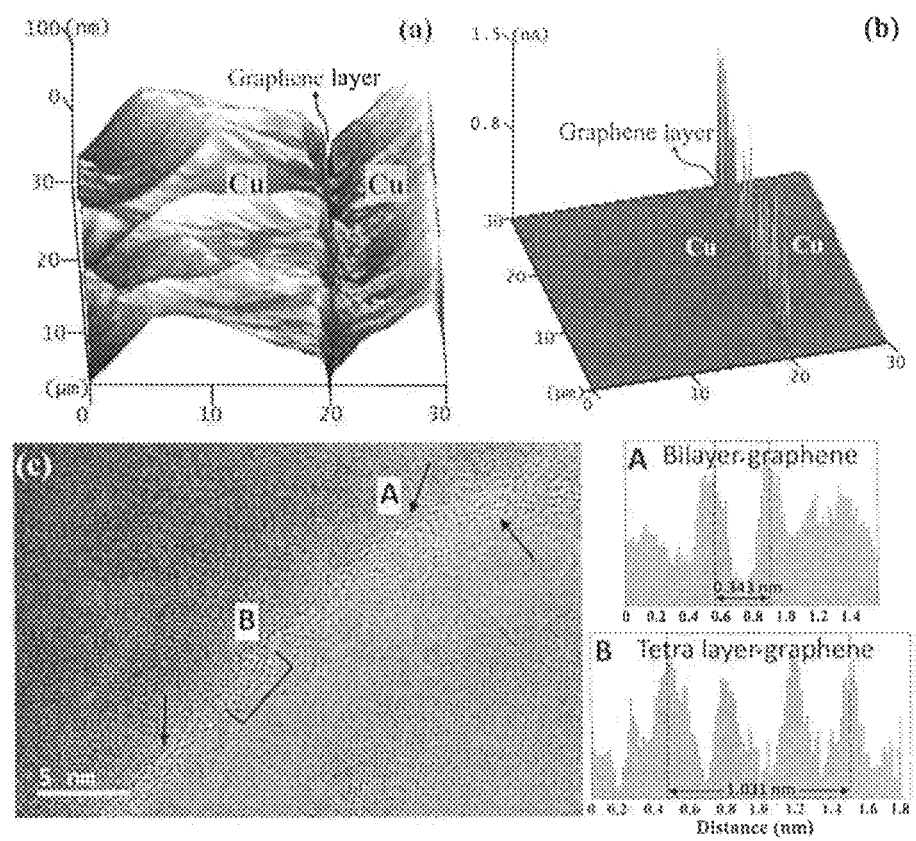
FIG. 4 is a characterization of Cu/graphene layer/Cu interface by atomic force microscopy according to an example.

FIG. 4 is a characterization of Cu/graphene layer/Cu interface by atomic force microscopy. FIG. 4 a shows the interface morphology and FIG. 4 b shows the typical current-mapping image generated by using the contact-current mode of an atomic force microscope 22. The graph plots the current flow across a 30 μm×30 μm mapping area containing a single graphene edge. The current flow in the region of the sandwiched graphene is up to 3 orders of magnitude higher than in the pure Cu area. FIG. 4c is a TEM image of a graphene-Cu interface that shows mostly bilayer graphene with some tri- and tetra-layer graphene. Two high-intensity peaks separated by the expected inter-planar spacing of 0.343 nm were observed in region (A) (marked with arrows), whereas four high-intensity peaks were observed in region (B) (marked with line segment).

The measuring area covered 30 μm×30 μm on the cross section. The electrical current drastically increases at each graphene (double)-layer to values about three orders of magnitude higher than at the surrounding Cu matrix. The fluctuations observed in the electrical current might be caused by the polycrystalline and discontinuous nature of the deposited graphene.

Detailed cross-sectional transmission electron microscopy (TEM) images and histograms of line scans across the interface are shown in FIG. 4c; the images indicate the presence of interfaces with both bilayer (region (A)) and tetra-layer graphene (region (B)).

Although the volume fraction of the highly conductive graphene interface in the here fabricated Cu/Gr-Gr/Cu multilayered composites is very small (less than 1/30,000 as estimated from the thickness of the graphene layer and Cu foil) and thus their contribution to the enhanced electrical conductivity is still limited (currently 16%), the Cu/Gr-Gr/Cu interface provides a model for preparing ultra-conductive Gr/Cu composites. It is contemplated that, by increasing the volume fraction of Cu/Gr-Gr/Cu layers in the bulk composite, the conductivity could be increased much further, with the above measured conductivity across the Gr-Gr layer (orders of magnitude higher than pristine Cu) being the theoretical limit. Also, a nano-layered structure with a multitude of Gr-Cu interfaces, which could be obtained using the bioinspired route established for metal matrix composites (see FIG. 14) could be used to fabricate bulk ultra-conductive Cu/Gr composites, cf. Z. Li, Q. Guo, Z. Q. Li, G. L. Fan, D.-B. Xiong, Y. S. Su, J. Zhang, D. Zhang, Nano Lett. 2015, 15, 8077; and Z. Li, G. L. Fan, Z. Q. Tan, Z. Q. Li, Q. Guo, D.-B. Xiong, D. Zhang, Nano-Micro Lett. 2016, 8, 54; and J. Y. Wang, Z. Q. Li, G. L. Fan, H. H. Pan, Z. X. Chen, D. Zhang, Scrip. Mater. 2012, 66, 594.

Figure 14:
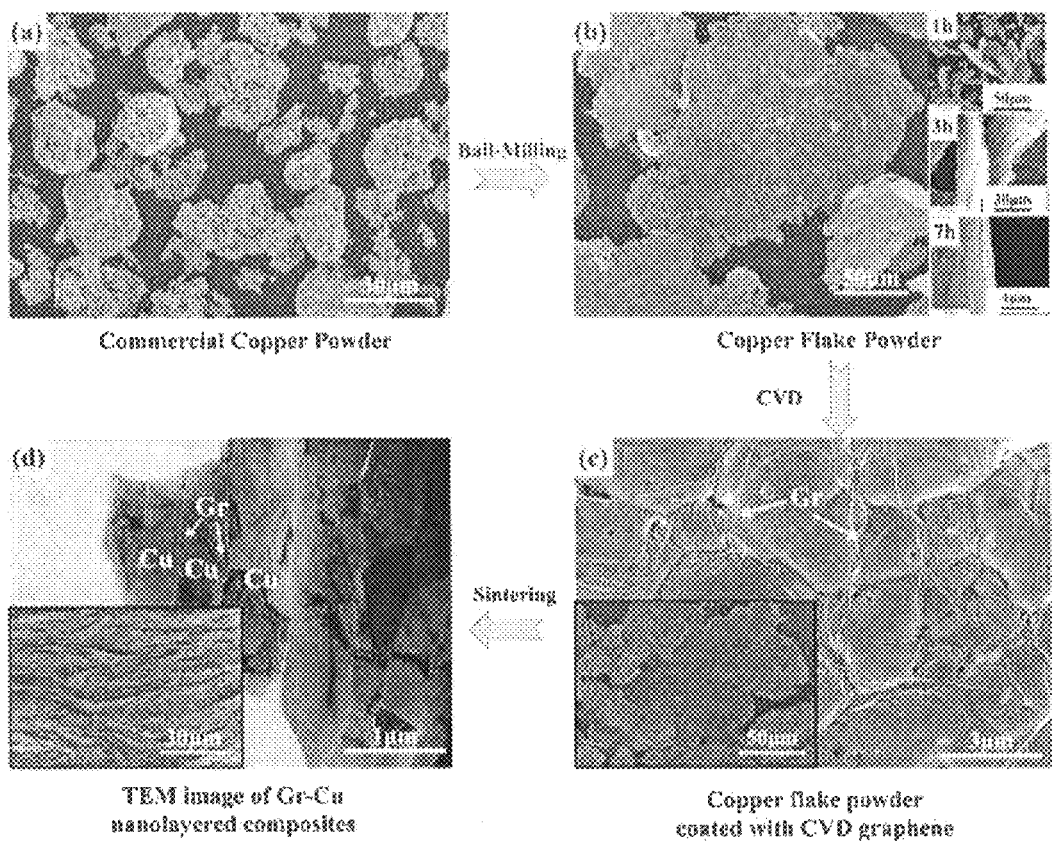
FIG. 14 shows a fabrication route for graphene-Cu matrix composites with a bioinspired nano-layered structure according to an example.

FIG. 14 shows a fabrication route for graphene-Cu matrix composites with a bioinspired nano-layered structure. Commercial copper powder (a) was converted to copper flake powder (b) by a ball-milling process. The thickness of the copper flakes could be easily controlled in the range of several hundred nanometers to tens of micrometers by adjusting the ball-milling time (for example 1, 3 and 7 hours as shown in (b)). (c) Then graphene (Gr) was deposited on the surface of the copper flakes via a chemical vapor deposition method. It can be seen that the graphene (Gr) was homogenously deposited on the surfaces of the flakes. The number of layers of the deposited graphene could be controlled by adjusting the carbon source concentration. Bulk composite samples were produced by self-assembling and solidifying the graphene-coated copper flakes. (d) TEM shows that a uniform nano-layered structure was obtained. The inset SEM image is the fractured surface morphology of the Gr-Cu composite showing a clear nano-layered structure.

Figures 5A, 5B:
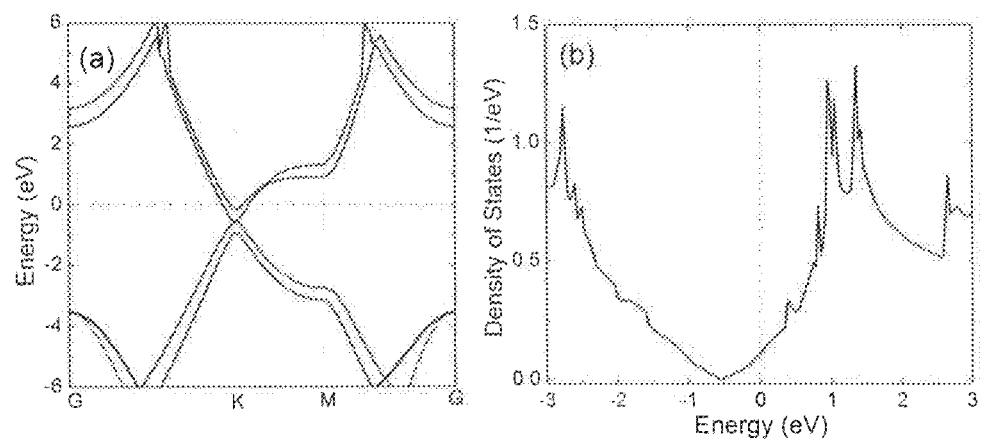
FIG. 5A shows a band structure and FIG. 5B shows the density states for the doped AB-bilayer graphene according to an example.

FIG. 5A shows a band structure and FIG. 5B shows the density of the states for the doped AB-bilayer graphene. The zero point denotes the Fermi energy. In order to better understand the origin of the large enhancement of the interface conductivity, a study of the role of graphene in the composite on an atomic level was performed using first-principles calculations based on a practical model of a Cu/Gr bilayer/Cu interface (see FIG. 15). We found that, on average, a primitive cell of the bilayer graphene (containing four carbon atoms) obtains about 0.24 electrons (cf. Table 2) from the neighboring Cu atoms in the matrix, indicating a doping effect in the graphene with an estimated electron density of ~$1\times10^{12}$ cm$^{-2}$. Moreover, as can be seen from the band structure and density of the states for the doped bilayer graphene (FIG. 5), the Fermi energy is shifted upwards by about 0.54 eV from the Dirac point due to the electron doping, as compared to the pristine bilayer graphene.

The first-principles calculation was carried out using VASP code, cf. G. Kresse, J. Furthmüller, Phys. Rev. B, 1996, 54, 11169. The Cu/Gr bilayer/Cu interface was modeled by an AB-stacked graphene bilayer which was sandwiched between fourteen Cu(111) layers (see FIG. 15). The model system has a three-dimensional periodicity, and the lattice constant of the Cu(001) and graphene is 3.614 Å and 2.46 Å, respectively. The inter-layer distance of the AB-graphene is 3.430 Å, and the separation between the Cu and graphene is 2.210 Å, which is determined by minimization of the total energy. In our calculations, the projector augmented-wave method according to P. E. Blöchl, Phys. Rev. B, 1994, 50, 17953 was used for the wave function expansion with an energy cutoff of 500 eV. The local density approximation was adopted for the electron exchange and correlation. The Brillouin zone was sampled with a 9×1×5 grid in the k space with the Monkhorst-Pack scheme, cf. H. J. Monkhorst, J. D. Pack, Phys. Rev. B, 1976, 13, 5188.

Effective doping has been previously reported in graphene on metal substrates, which could result in a comparable but lower energy shift of the Fermi energy (0.3 eV above the Dirac point) of graphene on a Cu substrate. The doping electrons in a doped Gr bilayer have large Fermi velocities because of the linear energy dispersion relation near the Dirac points, which leads to a very high carrier mobility of three orders of magnitude higher than in copper. Therefore it is posited that the significant enhancement of interface conductivity can be explained by the electron doping effect in graphene that results in a largely increased carrier density as well as very high carrier mobility in the graphene, leading to an extreme in-plane electrical transport capability. It is also posited that the graphene double layer might provide for an advantageous defect compensation effect between the individual graphene lattice structures in case one of the layers is for instance mechanically locally disturbed, polycrystalline, or of otherwise discontinuous nature. Electrons could still flow easily through the second undisturbed layer which is as well connected to the Cu electron sea, however on the opposite side.

Figure 15:
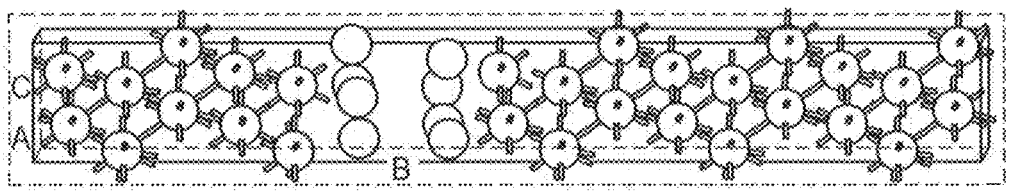
FIG. 15 shows a model system for the Cu/Gr bilayer/Cu composite according to an example.

FIG. 15 shows a model system for the Cu/Gr bilayer/Cu composite. The yellow and grey spheres denote the Cu and C atoms, respectively. A, B and C denote the lattice parameters of this periodical model system, and they are arranged along the X, Y and Z axis, respectively. We obtained the total charge of the Cu/Gr bilayer/Cu system and analyzed the Bader charge which is shown in Table 2. It shows that the graphene atoms have 32.480 valence electrons in total. The graphene obtained 0.480 electrons from the neighboring Cu atoms in total. It means that a primitive cell of the bilayer (containing four carbon atoms) is doped with 0.24 electrons. We also calculated the band structure and the density of states (see FIG. 5) of the AB-bilayer graphene using a primitive cell with 0.24 doping electrons by VASP. The lattice constant is 2.46 Å for the graphene. The Brillouin zone is sampled with a 21×21×1 grid of the Monkhorst-Pack k points.

Referring below to Table 2, the valence charge of the AB-bilayer graphene sandwiched between the Cu(111) layers. X, Y and Z are the Cartesian coordinates of the graphene atoms. The graphene layers lie in the X-Z plane.

TABLE 2

| Atom type | No. | X | Y | Z | Charge |
|---|---|---|---|---|---|
| C | 1 | 0.7988 | 11.6100 | 2.6749 | 4.1468 |
| C | 2 | 2.0769 | 11.6100 | 0.4612 | 4.1465 |
| C | 3 | 2.0769 | 11.6100 | 1.9370 | 3.9698 |
| C | 4 | 0.7988 | 11.6100 | 4.1507 | 3.9701 |
| C | 5 | 2.0769 | 14.9400 | 0.4612 | 3.9721 |
| C | 6 | 0.7988 | 14.9400 | 2.6749 | 3.9721 |
| C | 7 | 0.7988 | 14.9400 | 1.1991 | 4.1513 |
| C | 8 | 2.0769 | 14.9400 | 3.4128 | 4.1510 |

Figure 16:
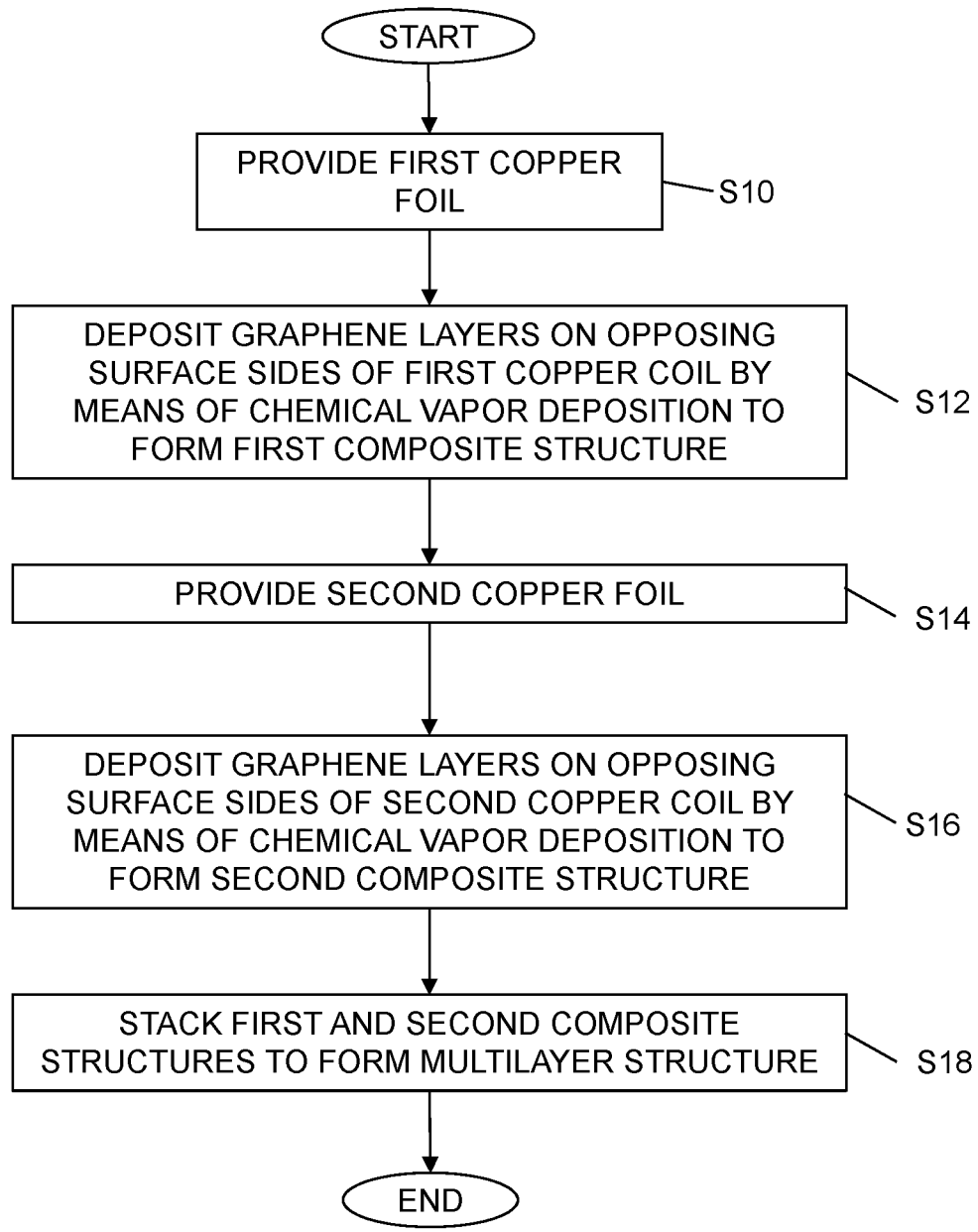
FIG. 16 shows a flow diagram illustrating a method for forming a multilayer structure according to an example.

A flow diagram illustrating a method for forming a multilayer structure according to an example is shown in FIG. 16.

In a first block S10, a first copper foil is provided.

In a second block S12, graphene layers are deposited on opposing surface sides of the first copper foil by means of chemical vapor deposition to form a first composite structure.

In a third block S14, a second copper foil is provided.

In a fourth block S16, graphene layers are deposited on opposing surface sides of the second copper foil by means of chemical vapor deposition to form a second composite structure.

In a fifth block, S18, the first composite structure and the second composite structure are stacked to form a multilayer structure.

The method is not limited to a specific order. For instance, the flow diagram of FIG. 16 shows a step of providing a second copper foil after a step of depositing graphene layers on opposing surface sides of the first copper foil. However, this is merely an example. In other examples, graphene layers may be deposited on opposing surface sides of the first and second copper foil simultaneously, after the first and second copper foil have been provided.

We have demonstrated experimentally that hot pressed Cu/Gr-Gr/Cu multilayered composites possess a strongly enhanced bulk electrical conductivity as compared to the reference pristine Cu or annealed Cu. An electrical conductivity as high as 116% IACS was achieved in the as-obtained composite at room temperature, which is even higher than that of Ag. The observed improvement of the electrical properties of Gr/Cu composites is believed to be primarily caused by: (a) the changes in Cu grain size and orientation caused by CVD of graphene, promoting the curing of grain boundaries and increasing of crystallinity combined with preferred atomic lattice matching between graphene and copper during hot-pressing; and (b) the ultrahigh conductivity of the double layered graphene interface of three orders of magnitude higher than that of the copper matrix.

The effect of graphene is projected to be comparably strong in substantially larger sized bulk Gr/Cu Nano-layered composites. Enhancement of the electrical properties of Cu is important for reducing energy consumption and offering benefits for downscaled electronics. Our results indicate that incorporating graphene into a Cu matrix can substantially improve its electrical conductivity up to a level higher than that of the most conductive metal Ag, which may lead to a transformational change in the use of carbon in metallurgy.

Example: Sample Preparation

Graphene was deposited on both sides of Cu foils via chemical vapor deposition. In a typical process Cu foils 12 as shown in FIG. 1 with a thickness of H≈30 μm were heated up to 1,000° C. in a hydrogen/argon atmosphere and then methane was introduced for graphene growth. The Cu foils were cooled down to room temperature within 30 minutes to grow single layer graphene on both sides of the Cu foil, thus Gr-Cu-Gr foils 10 were obtained (FIG. 6). The annealing of the pristine ("as rolled") copper reference samples 14 was performed with the same heating and cooling process but without methane addition.

In order to prepare thicker sheet samples, several pieces of Gr-Cu-Gr foil 10 were stacked on top of each other in a graphite mold and then hot-pressed at 900° C. for 20 minutes in an 50 MPa Ar atmosphere to obtain the multilayer structure 16. Thick sheet reference samples of pristine Cu 18 and annealed Cu 20 were also prepared under the same hot pressing conditions. The typical thickness of a stacked and sintered sheet sample was about 150 μm.

Figure 6A:
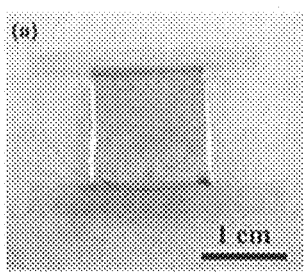
FIG. 6A shows a photograph of a chemical vapor deposition graphene/copper single foil.
Figure 6B:
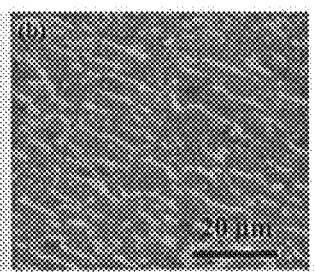
FIG. 6B shows a SEM image of graphene crystals on Cu foil prepared by chemical vapor deposition.
Figure 6C:
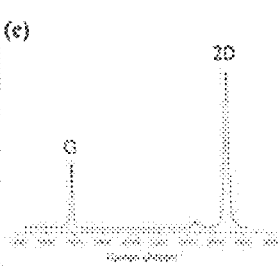
FIG. 6C shows Raman spectroscopy of deposited graphene according to an example.
Figure 8:
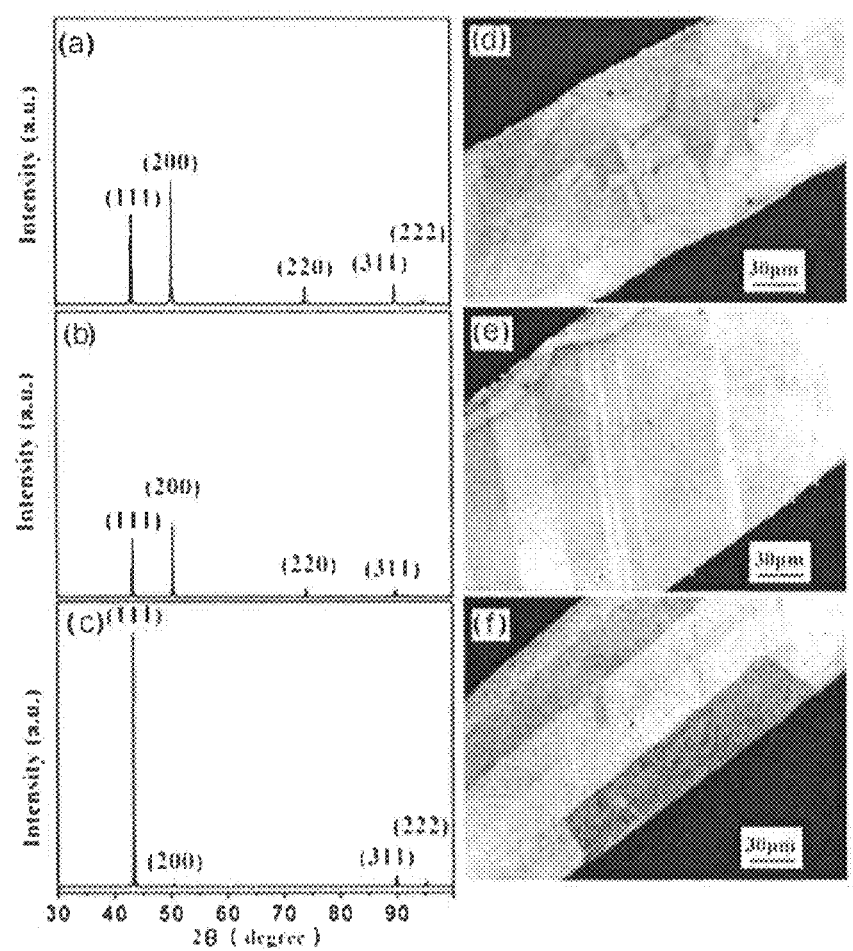
FIG. 8 shows in-plane XRD patterns and cross-section optical images of hot-pressed multilayers of: pristine Cu, annealed Cu, and Gr/Cu according to an example.

FIG. 6A shows a photograph of a CVD graphene/copper single foil; FIG. 6B shows a SEM image of graphene crystals on Cu foil prepared by CVD; the graphene surface coverage is almost 95%; and FIG. 6C depicts the results of a Raman spectroscopy of the deposited graphene which shows that the graphene deposited on the copper surface is a single layer with $I_{2D}/I_G \approx 2.3$. FIG. 7 shows in-plane XRD patterns (left) and cross-section optical images (right) of single foils of: (a,d) pristine Cu, (b,e) annealed Cu, and (c,f) Gr/Cu. FIG. 8 shows in-plane XRD patterns (left) and cross-section optical images (right) of hot-pressed multilayers of: (a,d) pristine Cu, (b,e) annealed Cu, and (c,f) Gr/Cu.

Example: Conductivity Measurements

Figure 9:
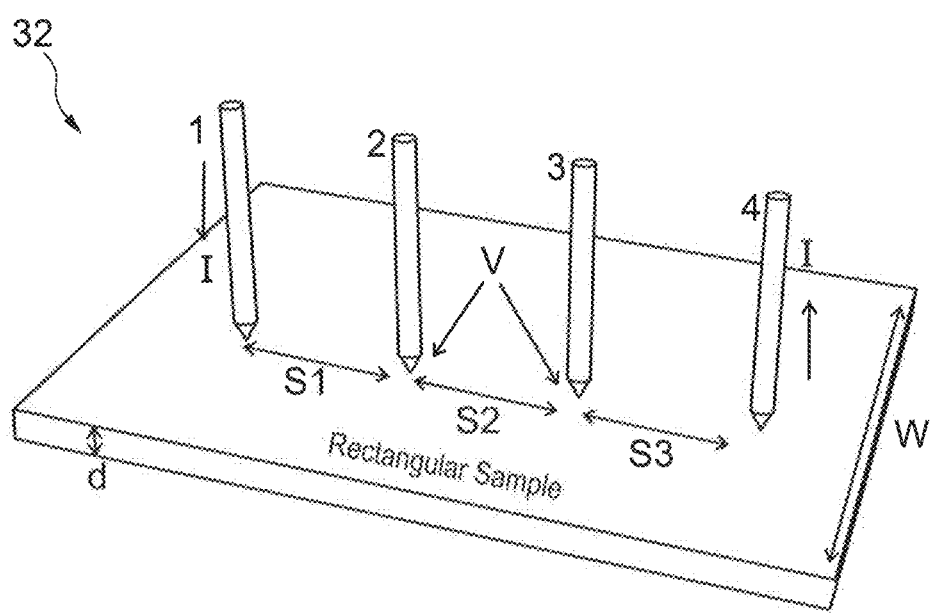
FIG. 9 is a schematic representation of the electrical conductivity measurement with the four-probe conductivity meter according to an example.

According to an example, the electrical conductivity measurement was carried out using a four-probe conductivity meter 32 as schematically illustrated in FIG. 9, after the sample surfaces were carefully polished. The measuring principle diagram of the four-probe conductivity meter 32 is shown in FIG. 9. Before the actual measurement, the metal probes 1,2,3,4 were arranged in a straight line, and then pressed with a well-defined force onto the surface of the individual samples. When a current I appears between probe 1 and probe 4, a corresponding potential difference V will be generated between probe 2 and probe 3. The material resistivity is then calculated according to Equation 1, $$\rho = C\frac{V}{I} \qquad \text{Equation (1)}$$

In Equation (1), C denotes the probe correction factor for a sample with uniform resistivity. The size of the sample can be assumed to satisfy the semi-infinite condition Equation 2, $$C = \frac{2\pi}{\frac{1}{S1} + \frac{1}{S2} - \frac{1}{S1+S2} - \frac{1}{S2+S3}}$$ Equation (2)

in which S1, S2, and S3 are the distances between probe 1-2, probe 2-3, and probe 3-4 respectively. Because the thickness of the thin sheet samples is close to the distance between the probes, and thus does not conform to the semi-infinite boundary condition, a correction factor for the thickness, shape, and the probe position is required for the calculation. The resistivity value can then be obtained by the following Equation 3, $$\rho = C \frac{V}{I} \cdot G\left(\frac{d}{s}\right) \cdot D\left(\frac{w}{s}\right)$$ Equation (3)

where $$G\left(\frac{d}{s}\right)$$

is the sample thickness correction function, and $$D\left(\frac{w}{s}\right)$$

is the sample shape and measuring position correction function d is the thickness of the samples, W is the width of the rectangular sample, and s is the probe spacing (~1 mm). Finally, the electrical conductivity can be calculated as the inverse of resistivity, or as 1/resistivity.

In order to ensure the accuracy and reproducibility of the measurements, we used a precision wire-electrode cutting technique to cut the individual samples to exactly the same rectangular shape (10×5 mm) and thickness (200~230 μm). The samples were polished with a 0.5 micron $Al_2O_3$ polishing powder in order to avoid any rough-surface-effects on the on conductivity measurement.

Example: XPX and EDX Measurements

FIG. 10 shows XPS data for the annealed Cu single foil, and Cu single layer foil with chemically deposited (CVD) graphene. In order to verify the materials composition of the individual samples, we performed X-ray photoelectron spectroscopy (XPS) after CVD of graphene and after annealing of the reference samples. XPS is a surface-sensitive quantitative spectroscopic technique that measures the elemental composition. It was found that the impurity content (i.e. surface contamination by mainly O, N) of the Cu samples with deposited graphene does not differ from the annealed Cu samples without graphene. It was also verified that the oxygen content had not changed after annealing or graphene deposition.

We have also performed energy-dispersive X-ray spectroscopy (EDX) for verifying the elemental composition of the samples. Similarly, the data did not indicate any change in the composition of the samples after CVD of graphene or after annealing. Therefore, we conclude that the observed change in the electrical conductivity was not caused by any surface contamination or change in material composition.

Figure 11:
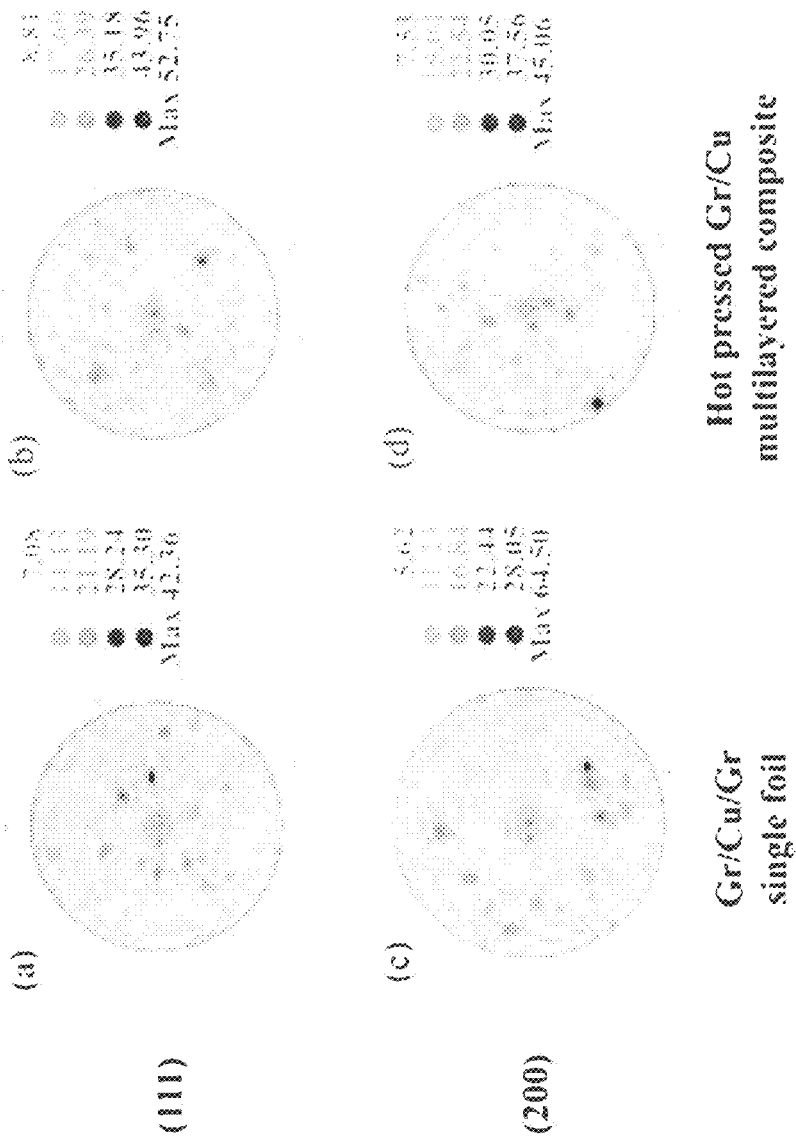
FIG. 11 shows X-ray diffraction pole figures of the (111) plane and the (200) plane of the Gr/Cu/Gr single foil, and the (111) plane and the (200) plane Gr-Cu of the hot-pressed Gr/Cu multilayered composite according to an example.

FIG. 11 depicts X-ray diffraction pole figures of (a) the (111) plane and (c) the (200) plane of the Gr/Cu/Gr single foil, and (b) the (111) plane and (d) the (200) plane Gr-Cu of the hot-pressed Gr/Cu multilayered composite. The intensities are color coded according to the tables on the right side of the individual pole figures with the respective maximum value shown in red.

The description of the embodiments and the Figures merely serve to illustrate the techniques of the disclosure, but should not be understood to imply any limitation. The scope is to be determined on the basis of the appended claims.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context.

The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A multilayer composite structure, comprising:
   a first copper layer,
   a first graphene layer disposed on one side of the first copper layer, wherein the first graphene layer is deposited on the first copper layer by a chemical vapor deposition (CVD) process,
   a second graphene layer disposed adjacent the first graphene layer, and
   a second copper layer disposed on the second graphene layer, wherein the second graphene layer is deposited on the second copper layer by the CVD process;
   wherein the first graphene layer and the second graphene layer are directly bonded using a hot-pressing process;
   wherein the first and second copper layers have grain re-orientation, curing of grain boundaries, and increased crystallinity resulting from the hot pressing process than annealed copper; and
   wherein the multilayer composite structure has an enhanced electrical conductivity that is higher than an electrical conductivity of silver (Ag).

2. The multilayer composite structure according to claim 1, wherein the multilayer composite structure has an electric conductivity of at least 116% of the International Annealed Copper Standard (IACS).

3. The multilayer composite structure according to claim 1, wherein at least one of the first graphene layer and the second graphene layer is one of a graphene monolayer and a graphene bi-layer.

4. The multilayer composite structure according to claim 1, wherein at least part of the first copper layer and/or the second copper layer has a (111) crystallographic orientation.

5. The multilayer composite structure according to claim 1, wherein a lattice constant of at least one crystalline plane of the first copper layer is within 4% of a lattice constant of the first graphene layer and/or wherein a lattice constant of at least one crystalline plane of the second copper layer is within 4% of a lattice constant of the second graphene layer.

* * * * *